(12) United States Patent
Sekar et al.

(10) Patent No.: US 9,390,798 B2
(45) Date of Patent: Jul. 12, 2016

(54) 1T-1R ARCHITECTURE FOR RESISTIVE RANDOM ACCESS MEMORY

(71) Applicant: Rambus Inc., Sunnyvale, CA (US)

(72) Inventors: Deepak Chandra Sekar, San Jose, CA (US); Wayne Frederick Ellis, Campbell, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 14/567,988

(22) Filed: Dec. 11, 2014

(65) Prior Publication Data

US 2016/0078934 A1    Mar. 17, 2016

Related U.S. Application Data

(60) Provisional application No. 62/050,326, filed on Sep. 15, 2014.

(51) Int. Cl.
| G11C 13/00 | (2006.01) |
| G11C 5/06 | (2006.01) |
| G11C 5/02 | (2006.01) |

(52) U.S. Cl.
CPC ........ *G11C 13/0069* (2013.01); *G11C 13/0097* (2013.01); *G11C 5/02* (2013.01); *G11C 5/06* (2013.01); *G11C 13/0002* (2013.01); *G11C 13/003* (2013.01)

(58) Field of Classification Search
CPC ........... G11C 13/0069; G11C 13/0002; G11C 13/003; G11C 5/06; G11C 5/02
USPC ........................................................ 365/148
See application file for complete search history.

(56) References Cited

U.S. PATENT DOCUMENTS

| 8,279,654 | B2 | 10/2012 | Otsuka | |
|---|---|---|---|---|
| 8,289,749 | B2 | 10/2012 | Chen et al. | |
| 8,324,607 | B2 | 12/2012 | Rolbiecki et al. | |
| 8,649,206 | B2 | 2/2014 | Scheuerlein | |
| 8,817,521 | B2 | 8/2014 | Chen et al. | |
| 2004/0114428 | A1* | 6/2004 | Morikawa | G11C 11/15 365/158 |
| 2007/0127302 | A1* | 6/2007 | Okamoto | G11C 7/14 365/233.11 |
| 2007/0159870 | A1* | 7/2007 | Tanizaki | G11C 11/16 365/148 |
| 2012/0069626 | A1* | 3/2012 | Nakano | G11C 13/0004 365/148 |
| 2012/0155146 | A1* | 6/2012 | Ueda | G11C 11/1659 365/148 |
| 2012/0223284 | A1* | 9/2012 | Tamai | H01L 45/08 257/4 |
| 2013/0329484 | A1* | 12/2013 | Tamai | G11C 13/0069 365/148 |
| 2014/0036573 | A1* | 2/2014 | Ishihara | G11C 13/0021 365/148 |
| 2014/0133211 | A1 | 5/2014 | Nazarian et al. | |

* cited by examiner

*Primary Examiner* — Ly D Pham
(74) *Attorney, Agent, or Firm* — Lowenstein Sandler LLP

(57) ABSTRACT

A memory device includes an array of resistive memory cells wherein each pair of resistive memory cells includes a first switching element electrically coupled in series to a first resistive memory element and a second switching element electrically coupled in series to a second resistive memory element. A source of the first switching element and a source of the second switching element receive a common source line signal.

20 Claims, 12 Drawing Sheets

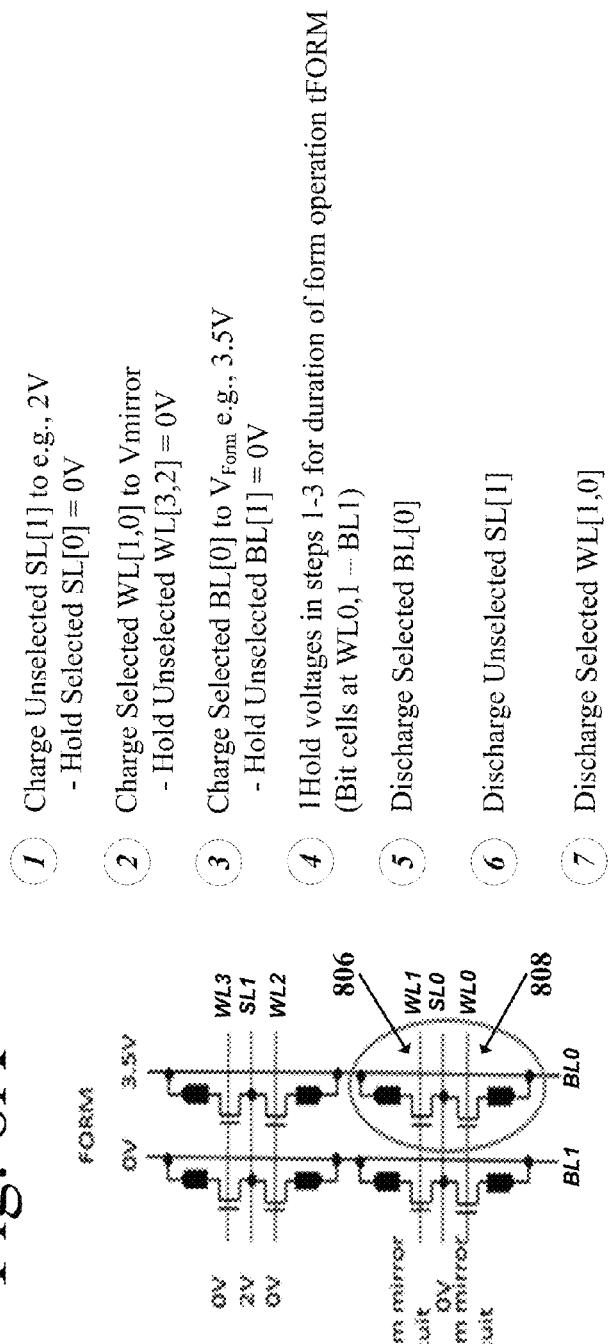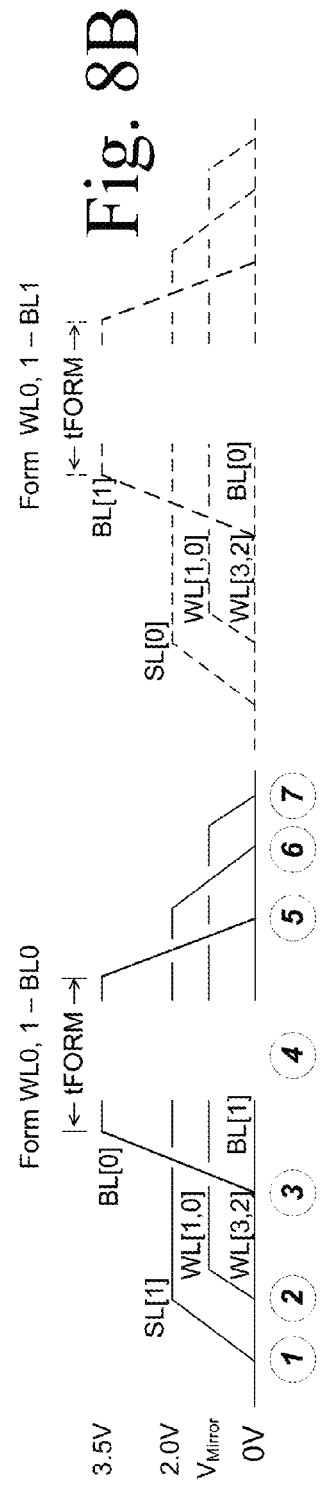

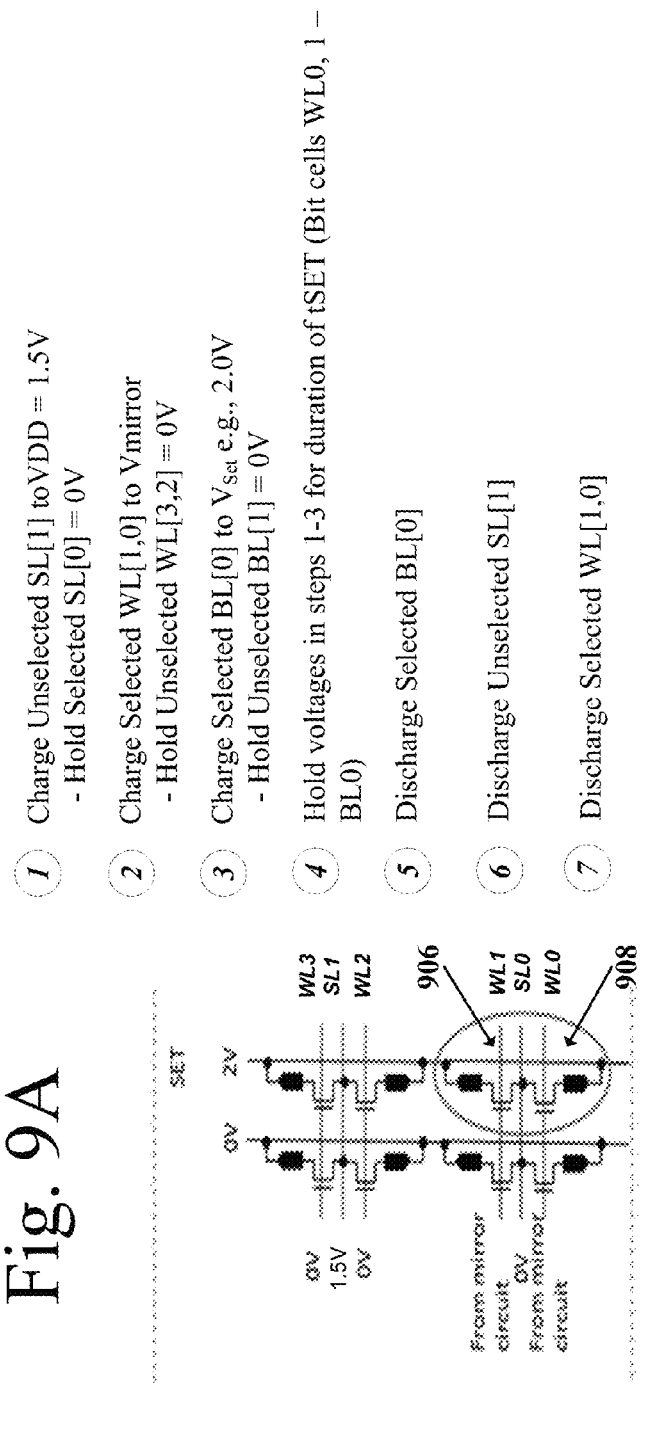
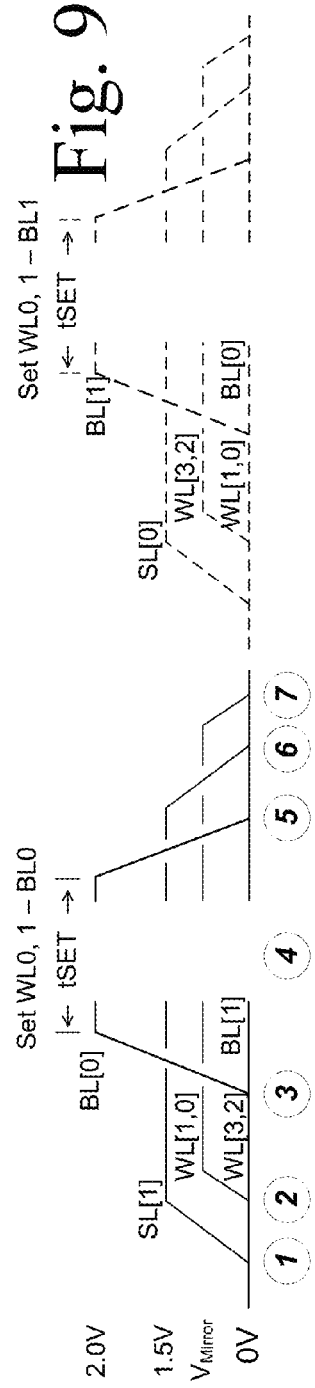
Fig. 9A
Fig. 9B
1. Charge Unselected SL[1] to VDD = 1.5V
   - Hold Selected SL[0] = 0V
2. Charge Selected WL[1,0] to Vmirror
   - Hold Unselected WL[3,2] = 0V
3. Charge Selected BL[0] to $V_{set}$ e.g., 2.0V
   - Hold Unselected BL[1] = 0V
4. Hold voltages in steps 1-3 for duration of tSET (Bit cells WL0, 1 – BL0)
5. Discharge Selected BL[0]
6. Discharge Unselected SL[1]
7. Discharge Selected WL[1,0]

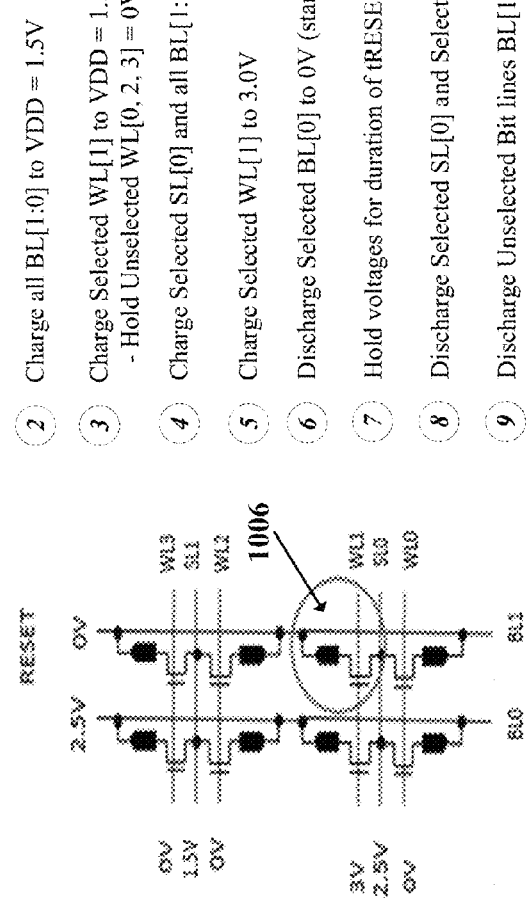
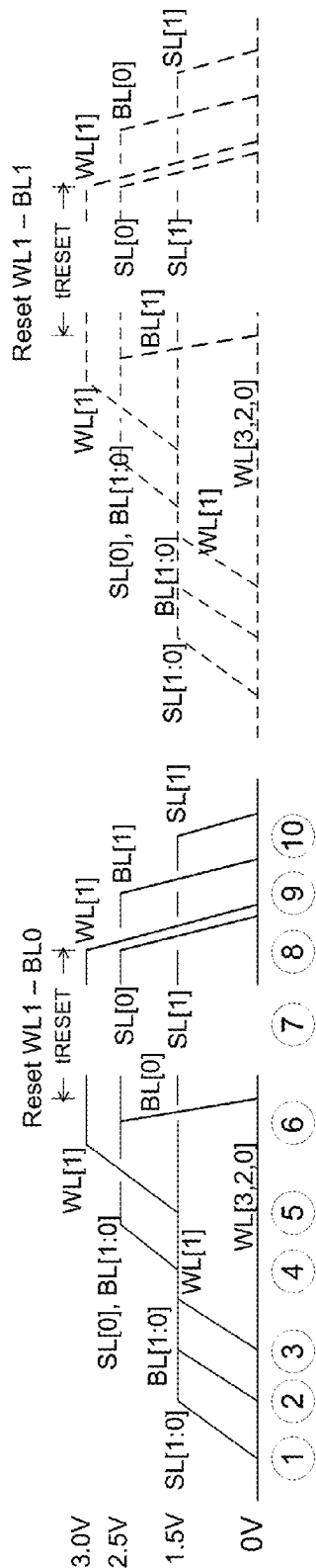
1. Charge all SL[1:0] to VDD = 1.5V
2. Charge all BL[1:0] to VDD = 1.5V
3. Charge Selected WL[1] to VDD = 1.5V - Hold Unselected WL[0, 2, 3] = 0V
4. Charge Selected SL[0] and all BL[1:0] to 2.5V
5. Charge Selected WL[1] to 3.0V
6. Discharge Selected BL[0] to 0V (start of RESET)
7. Hold voltages for duration of tRESET (Bit cell at WL1 – BL0)
8. Discharge Selected SL[0] and Selected WL[1]
9. Discharge Unselected Bit lines BL[1]
10. Discharge Unselected source lines SL[1]
Fig. 10A
Fig. 10B

1T-1R ARCHITECTURE FOR RESISTIVE RANDOM ACCESS MEMORY

RELATED APPLICATIONS

The present disclosure claims priority to U.S. provisional application 62/050326, filed Sep. 15, 2014, titled "CIRCUIT AND ARCHITECTURE SOLUTIONS FOR A 1TRANSISTOR-1RESISTOR CELL RRAM," which is incorporated herein by reference in its entirety.

TECHNICAL FIELD

The present disclosure relates to semiconductor memory and, more particularly, to resistive random access memory (RRAM) with a one transistor, one resistive element (1T-1R) memory cell architecture.

BACKGROUND

Non-volatile memory devices that retain stored data in the absence of power are pervasively used in consumer electronic products including cell phones, tablets, personal computers, personal digital assistants, and the like. Unfortunately, many non-volatile memory devices have limitations that make them unsuitable for use as primary storage for these products including higher cost and lower performance when compared to volatile memory devices such as dynamic random access memory (DRAM). Examples of older technology non-volatile memory devices include read-only memory (ROM) and flash memory. Examples of newer technology non-volatile memory devices include resistive random access memory (RRAM), phase change memory (PCM), spin-transfer torque magneto resistive random access memory (STT-MRAM), ferroelectric random access memory (FRAM), and many others.

RRAM operates on the basis that a typically insulating dielectric may be made to conduct through formation of a conduction path or filament upon application of a sufficiently high voltage. Formation of the conduction path may occur through different mechanisms, including defects and metal migration. Once the conduction path or filament forms, the filament may be reset (broken, resulting in high resistance) or set (reformed, resulting in lower resistance) by an appropriately applied voltage. Recent data suggests that the conduction path may include many conduction paths, rather than a single path through a single filament. RRAM devices including conductive bridge RAM (CBRAM) and transition metal oxide RRAM are a focal point for current development. In CBRAM devices, metal filaments between two electrodes form the conduction path, where one of the electrodes participates in the reaction. In transition metal oxide RRAM, oxygen vacancy filaments in a transition metal such as hafnium oxide or tantalum oxide form the conduction path.

RRAM devices used in consumer and communication applications may be required to retain data for 10 years at 85 degrees. In contrast, RRAM devices used in industrial and automotive applications may be required to retain data for 10 years at 125°. Further, RRAM devices used in consumer and communication applications often do not have the speed and processing requirements of RRAM devices used in industrial and automotive applications, which allows for simpler cell architectures capable of manufacture using conventional processing technologies. As such, RRAM devices with 1T-1R memory cell architectures may be attractive for use in consumer and communication applications.

BRIEF DRAWINGS DESCRIPTION

The present disclosure describes various embodiments that may be understood and fully appreciated in conjunction with the following drawings:

FIG. 3B is a diagram illustrating an embodiment of a method of operating a portion of a 1T-1R memory array to address punch-through;

FIG. 8A is a diagram of an embodiment of a voltage signal sequence applied to a portion of a 1T-1R memory array during a form operation;

FIG. 8B is a timing diagram of an embodiment of the voltage signal sequence applied to the portion of the 1T-1R memory array shown in FIG. 8A during the form operation;

FIG. 9A is a diagram of an embodiment of a voltage signal sequence applied to a portion of a 1T-1R memory array during a set operation;

FIG. 9B is a timing diagram of an embodiment of the voltage signal sequence applied to the portion of the 1T-1R memory array shown in FIG. 9A during the set operation;

FIG. 10A is a diagram of an embodiment of a voltage signal sequence applied to a portion of a 1T-1R memory array during a reset operation;

FIG. 10B is a timing diagram of an embodiment of the voltage signal sequence applied to the portion of the 1T-1R memory array shown in FIG. 10A during the reset operation;

DETAILED DESCRIPTION

Figure 1:
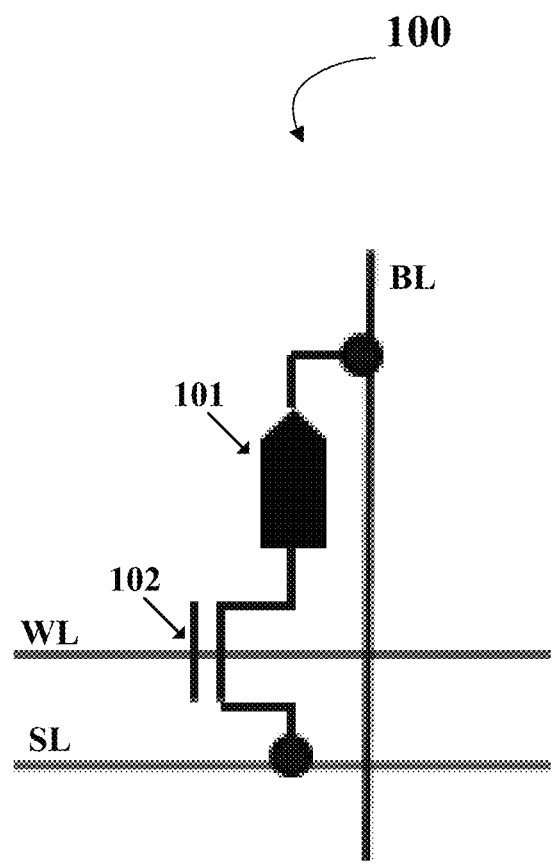
FIG. 1 is a diagram of an embodiment of a 1T-1R memory cell.

The present disclosure describes embodiments with reference to the drawing figures listed above. Persons of ordinary skill in the art will appreciate that the description and figures illustrate rather than limit the disclosure and that, in general, the figures are not drawn to scale for clarity of presentation. Such skilled persons will also realize that many more embodiments are possible by applying the inventive principles contained herein and that such embodiments fall within the scope of the disclosure which is not to be limited except by the claims.

Referring to FIG. 1, a 1T-1R memory cell 100 includes a memory element 101 electrically coupled in series to a select transistor 102 at a first end and coupled to a bit line terminal receiving a bit line signal BL at a second end. Select transistor 102 receives a word line signal WL at a gate and a source line signal SL at a source. Memory cell 100 may operate in response to bit line signal BL, word line signal WL, and source line signal SL.

Memory element 101 may include any kind of memory technology known to a person of ordinary skill in the art that changes resistance as a function of applied voltage or current, e.g., Resistive Random Access Memory (RRAM), Phase Change Memory (PCM), Spin-Transfer Torque Magnetic Random Access Memory (STT-MRAM), and the like.

Figure 2:
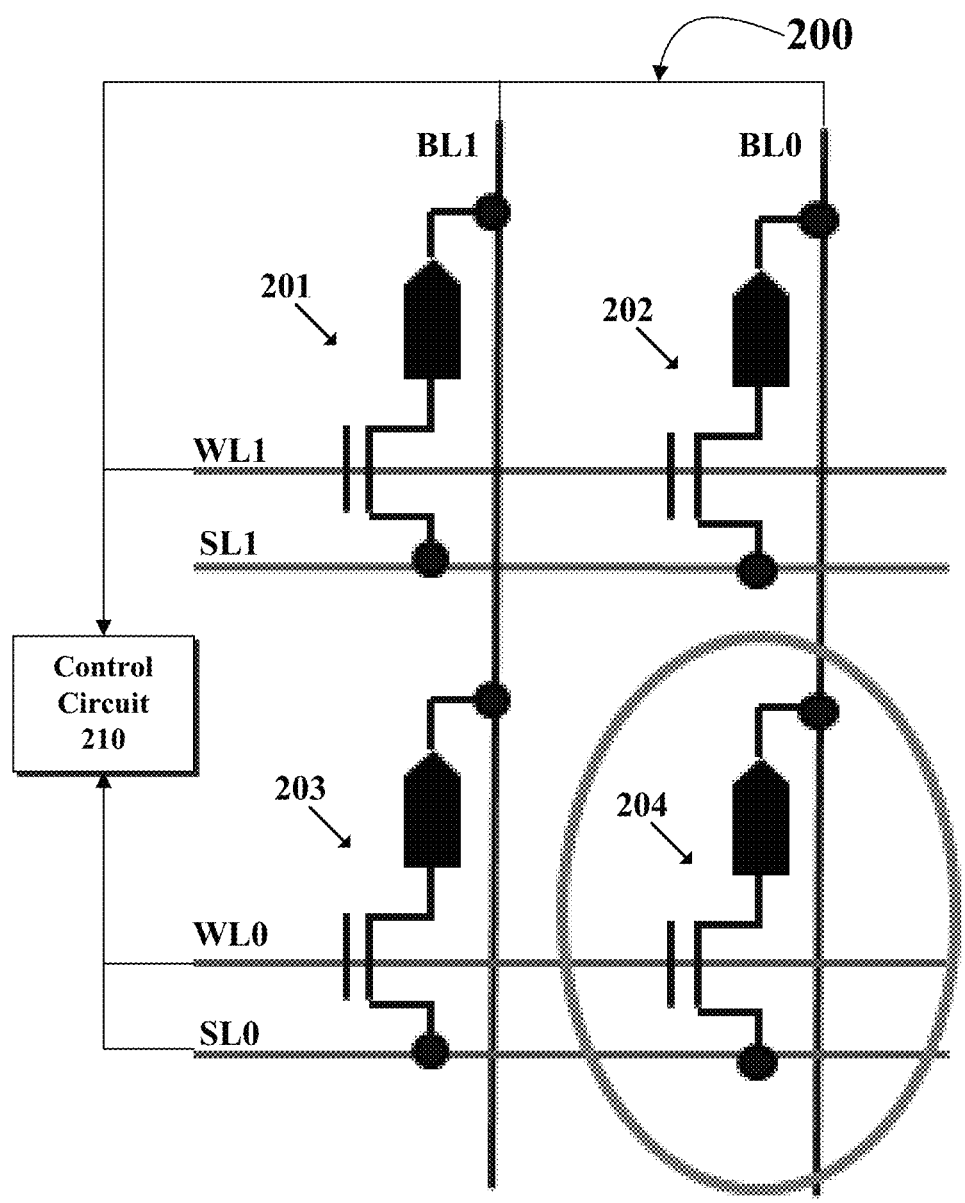
FIG. 2 is a diagram of an embodiment of a portion of a 1T-1R memory array.

FIG. 2 is a diagram of a portion of a 1T-1R memory array 200 including a plurality of memory cells, e.g., cells 201, 202, 203, and 204, arranged in a plurality of columns extending in a first direction and a plurality of rows extending in a second direction typically perpendicular to the first direction. Memory cells 201, 202, 203, and 204 may have a construction similar to that of memory cell 100 shown in FIG. 1. As with memory cell 100, each of memory cells 201, 202, 203, and 204 is coupled to receive a bit line signal, e.g., BL0 or BL1, word line signal, e.g., WL0 or WL1, and source line signal, e.g., SL0 or SL1. Memory cells 201, 202, 203, and 204 may include any type of memory technology known to a person of ordinary skill in the art that changes resistance as a function of applied voltage or current, e.g., RRAM, PCM, STT-MRAM, and the like.

In an embodiment of array 200, a column of memory cells is coupled to receive a common bit line signal while a row of memory cells is coupled to receive a common word line signal and a common source line signal. For example, memory cells 201 and 203 arranged on a first column commonly receive a first bit line signal BL0 while memory cells 202 and 204 arranged on a second column commonly receive a second bit line signal BL1. Memory cells 201 and 202 arranged on a first row commonly receive a first word line signal WL1 at corresponding gates and receive a first source line signal SL1 at corresponding sources. Likewise, memory cells 203 and 204 arranged on a second row commonly receive a second word line signal WL0 at corresponding gates and receive a second source line signal SL0 at corresponding sources.

In an embodiment, a control circuit 210 may generate voltage signals necessary to operate memory array 200 including bit line signals BL0 or BL1, word line signals WL0 or WL1, and source line signals SL0 or SL1 as is well known to a person of ordinary skill in the art. In an embodiment, control circuit 210 avoids voltage or high current stresses on the memory cells, e.g., memory cells 201, 202, 203, and 204 that would result in damage, wear out, reduced life, or the like, by applying the necessary voltage signals in predetermined levels and/or in a predetermined sequence as further described below.

Figure 3A:
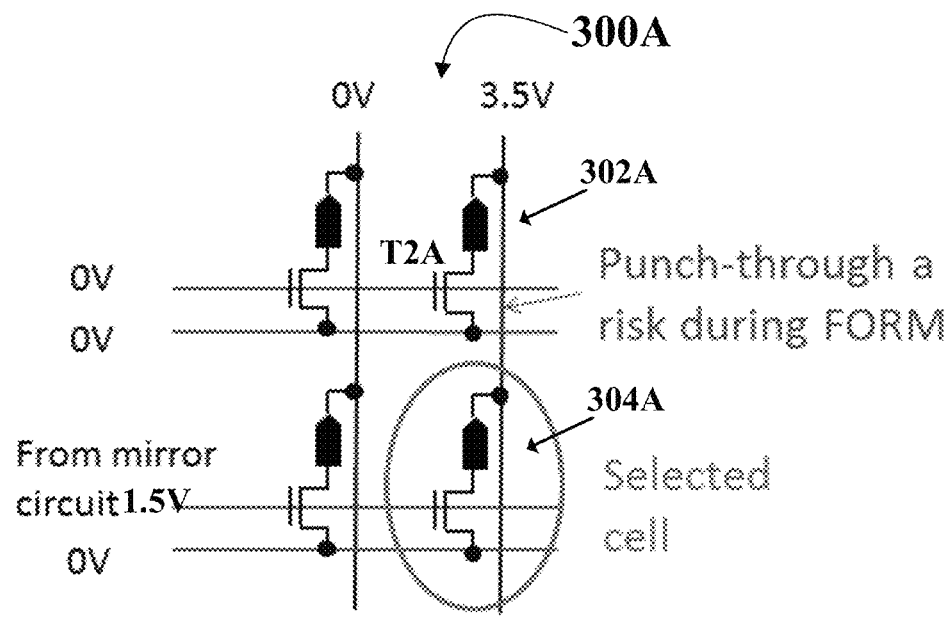
FIG. 3A is a diagram illustrating punch-through in a portion of a 1T-1R memory array.

FIG. 3A is a diagram illustrating punch-through in a portion of a 1T-1R memory array 300A. Punch-though refers to a situation in which the depletion layers around the drain and source regions of a transistor, e.g., select transistor T2A of memory cell 302A, merge into a single depletion region due to voltage overstress. The field underneath the gate of select transistor T2A then becomes strongly dependent on the drain-source voltage, as is the drain current. Punch through may cause a rapidly increasing current with increasing drain-source voltage, an effect that is undesirable as it may degrade the reliability of memory array 300A, may increase power requirements due to leakage currents in unselected cells, and may necessitate larger select transistors to avoid the problem among other undesirable issues.

Memory array 300A has all of its unselected source lines, e.g., SL1, biased at ground during a form operation. During the form operation of selected cell 304A, a voltage often greater than 3.5V may be applied to the selected bit line signal BL0, which, in turn, may cause punch-through for unselected cells, e.g., memory cell 302A, coupled to bit line signal BL0 since the voltage across the source and drain region is high at 3.5V.

Figure 3B:
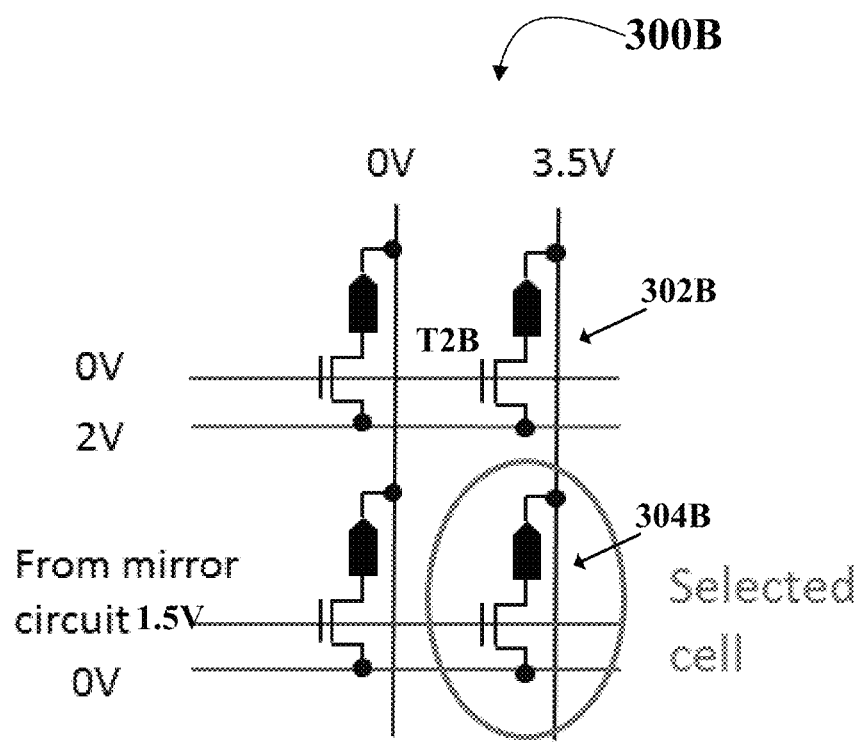

FIG. 3B is a diagram illustrating an embodiment of a method of operating a portion of a 1T-1R memory array 300B to avoid the undesirable punch-through failure shown in FIG. 3A. An exemplary bias scheme in which a memory cell 304B is selected for a form operation is shown in Table 1.

TABLE 1

| Form Operation | | |
|---|---|---|
| Selected bit line signal | BL0 | 3.5 V |
| Selected source line signal | SL0 | 0 V |
| Selected word line signal | WL0 | 1.5 V |
| Unselected bit line signal | BL1 | 0 V |
| Unselected source line signal | SL1 | 2 V |
| Unselected word line signal | WL1 | 0 V |

Punch-through of select transistor T2B of unselected memory cell 302B is avoided by biasing unselected source lines, e.g., SL1, at a voltage that is higher than ground and less than the selected bit line signal voltage BL1 of 3.5V. For example, punch-though of select transistor T2B is avoided by biasing unselected source line signals SL1 at an intermediate voltage of 2V. A person of skill in the art should recognize that unselected source lines may be biased at many other voltages higher than ground and less than the selected bit line signal voltage depending on various design parameters associated with memory array 300B to avoid punch-through of select transistors of unselected memory cells during form operations of selected memory cells.

Figure 4:
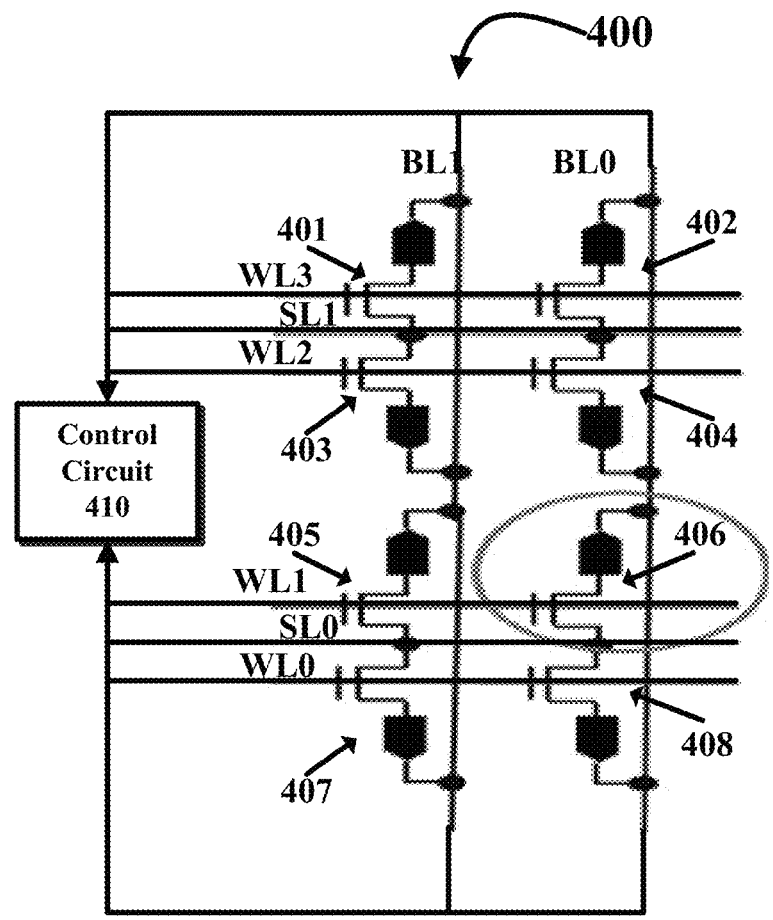
FIG. 4 is a diagram of an embodiment of a portion of a 1T-1T memory array.

FIG. 4 is a diagram of an embodiment of a portion of a 1T-1R memory array 400 in which memory cells positioned on adjacent rows are electrically coupled to a common source line. Memory array 400 may include a plurality of memory cells, e.g., cells 401, 402, 403, 404, 405, 406, 407, and 408, arranged in a plurality of columns extending in a first direction and a plurality of rows extending in a second direction perpendicular to the first direction. For example, memory cells 401 and 402 extend in a first row horizontally while memory cells 401, 403, 405, and 407 extend in a first column vertically.

Memory cells 401, 402, 403, 404, 405, 406, 407, and 408 may have a construction similar to that of memory cell 100 shown in FIG. 1. As with memory cell 100, each of memory cells 401, 402, 403, 404, 405, 406, 407, and 408 is coupled to receive a bit line signal, e.g., BL0 or BL1, a word line signal, e.g., WL0, WL1, WL2, or WL3, and a source line signal, e.g., SL0 or SL1. In an embodiment, a control circuit 410 may generate voltage signals necessary to operate memory array 400 including bit line signals BL0 and BL1, word line signals WL0, WL1, WL2, and WL3, and source line signals SL0 and SL1, as is well known to a person of ordinary skill in the art. In an embodiment, control circuit 410 avoids voltage or high current stresses on the memory cells, e.g., memory cells 401, 402, 403, 404, 405, 406, 407, and 408 that would result in damage, wear out, reduced life, or the like, by applying the necessary voltage signals in predetermined levels and/or in a predetermined sequence as further described below.

In an embodiment of memory array 400, a column of memory cells is coupled to receive a common bit line signal while a row of memory cells is coupled to receive a common word line signal and a common source line signal. For example, memory cells 401, 403, 405, and 407 arranged on a first column may commonly receive a bit line signal BL1 while memory cells 402, 404, 406, and 408 arranged on a second column may commonly receive a bit line signal BL0. Memory cells 401 and 402 arranged on a row may commonly receive a word line signal WL3 at corresponding gate terminals and receive a source line signal SL1 at corresponding source terminals. Likewise, memory cells 403 and 404 arranged on a row may commonly receive a word line signal WL2 at corresponding gate terminals and receive source line signal SL1 at corresponding source terminals. Memory cells 405 and 406 arranged on a row may commonly receive a word line signal WL1 at corresponding gate terminals and receive a source line signal SL0 at corresponding source terminals while memory cells 407 and 408 arranged on a row may commonly receive a word line signal WL0 at corresponding gate terminals and receive source line signal SL0 at corresponding source terminals.

In an embodiment, memory cells positioned on adjacent rows of memory array 400 may be electrically coupled to receive a common source line signal. For example, memory cells 401 and 402 positioned on a first row and memory cells 403 and 404 positioned on a second row adjacent to the first row may be coupled to receive common source line signal SL1. Similarly, memory cells 405 and 406 positioned on a third row and memory cells 407 and 408 positioned on a fourth row adjacent to the third row may be coupled to receive common source line signal SL0. As with memory cell 100, memory cells 401, 402, 403, 404, 405, 406, 407, and 408 may include any type of memory technology known to a person of ordinary skill in the art that changes resistance as a function of applied voltage or current, e.g., RRAM, PCM, STT-MRAM, and the like. Significant cell size reductions of, e.g., 15-25% may result from memory array 400 in which memory cells positioned on adjacent rows share source line signals.

Figure 5A:
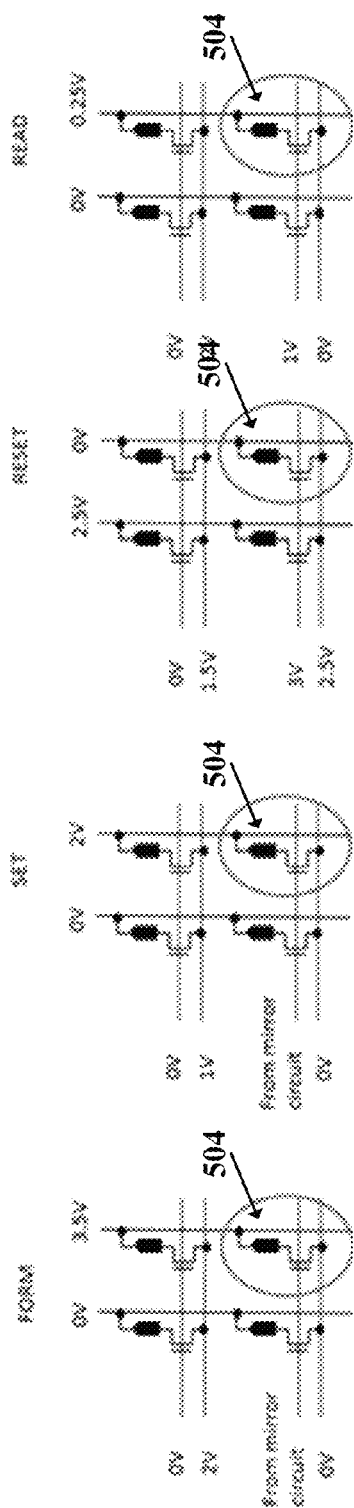
FIG. 5A are diagrams illustrating an embodiment of a method of biasing the portion of a 1T-1R memory array shown in FIG. 2 during form, set, reset, and read operations.

FIG. 5A are diagrams illustrating an embodiment of a method of operating the portion of memory array 200 shown in FIG. 2 during form, set, reset, and read operations to avoid punch-through or other undesirable effects. An exemplary bias scheme in which a memory cell 504 is selected for a form operation is shown in Table 1 above.

An exemplary bias scheme in which a memory cell 504 is selected for a set operation is shown in Table 2.

TABLE 2

| Set Operation | | |
|---|---|---|
| Selected bit line signal | BL0 | 2 V |
| Selected source line signal | SL0 | 0 V |
| Selected word line signal | WL0 | 1.5 V |
| Unselected bit line signal | BL1 | 0 V |
| Unselected source line signal | SL1 | 1 V |
| Unselected word line signal | WL1 | 0 V |

An exemplary bias scheme in which a memory cell 504 is selected for a reset operation is shown in Table 3.

TABLE 3

| Reset Operation | | |
|---|---|---|
| Selected bit line signal | BL0 | 0 V |
| Selected source line signal | SL0 | 2.5 V |
| Selected word line signal | WL0 | 3 V |
| Unselected bit line signal | BL1 | 2.5 V |
| Unselected source line signal | SL1 | 1.5 V |
| Unselected word line signal | WL1 | 0 V |

An exemplary bias scheme in which a memory cell 504 is selected for a read operation is shown in Table 4.

TABLE 4

| Read Operation | | |
|---|---|---|
| Selected bit line signal | BL0 | 0.25 V |
| Selected source line signal | SL0 | 0 V |
| Selected word line signal | WL0 | 1 V |
| Unselected bit line signal | BL1 | 0 V |
| Unselected source line signal | SL1 | 0 V |
| Unselected word line signal | WL1 | 0 V |

Figure 5B:
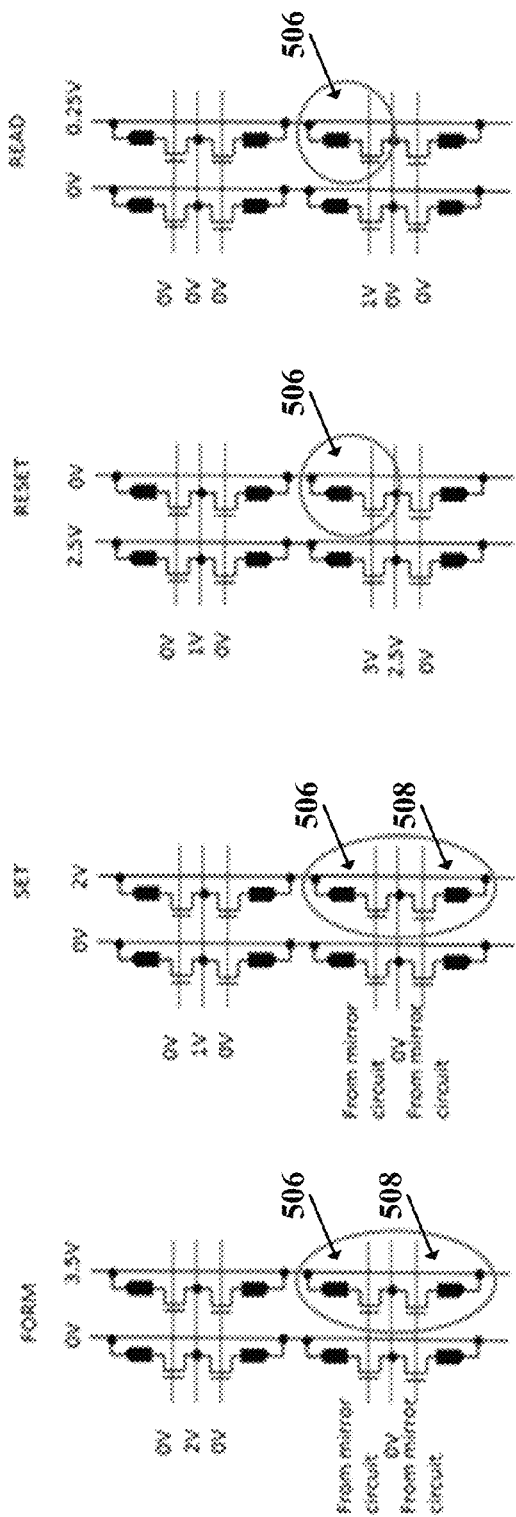
FIG. 5B are diagrams illustrating an embodiment of a method of biasing the portion of a 1T-1R memory array shown in FIG. 4 during form, set, reset, and read operations.

FIG. 5B are diagrams illustrating an embodiment of a method of biasing the portion of memory array 400 shown in FIG. 4 during form, set, reset, and read operations to avoid punch-through or other undesirable effects. For any byte to be written, a control circuit (not shown) may perform a set operation on all the memory cells corresponding to an addressed byte, and then only reset some of those memory cells (representing bits) based on the data to be written. Control circuit 410 may map addresses to allow a nearly simultaneous set and form operation performed on cells on adjacent rows.

An exemplary bias scheme in which memory cells 506 and 508 are selected for a form operation is shown in Table 5.

TABLE 5

| Form Operation | | |
|---|---|---|
| Selected bit line signal | BL0 | 3.5 V |
| Selected source line signal | SL0 | 0 V |
| Selected word line signal | WL0, WL1 | 1.5 V |
| Unselected bit line signal | BL1 | 0 V |
| Unselected source line signal | SL1 | 2 V |
| Unselected word line signals | WL2, WL3 | 0 V |

An exemplary bias scheme in which memory cells 506 and 508 are selected for a set operation is shown in Table 6.

TABLE 6

| Set Operation | | |
|---|---|---|
| Selected bit line signal | BL0 | 2 V |
| Selected source line signal | SL0 | 0 V |
| Selected word line signal | WL0, WL1 | 1.5 V |
| Unselected bit line signal | BL1 | 0 V |
| Unselected source line signal | SL1 | 1 V |
| Unselected word line signals | WL2, WL3 | 0 V |

An exemplary bias scheme in which a memory cell 506 is selected for a reset operation is shown in Table 7.

TABLE 7

| Reset Operation | | |
|---|---|---|
| Selected bit line signal | BL0 | 0 V |
| Selected source line signal | SL0 | 2.5 V |

TABLE 7-continued

Reset Operation

| | | |
|---|---|---|
| Selected word line signal | WL1 | 3 V |
| Unselected bit line signal | BL1 | 2.5 V |
| Unselected source line signal | SL1 | 1 V |
| Unselected word line signals | WL0, WL2, WL3 | 0 V |

An exemplary bias scheme in which a memory cell 506 is selected for a read operation is shown in Table 8.

TABLE 8

Read Operation

| | | |
|---|---|---|
| Selected bit line signal | BL0 | 0.25 V |
| Selected source line signal | SL0 | 0 V |
| Selected word line signal | WL1 | 1 V |
| Unselected bit line signal | BL1 | 0 V |
| Unselected source line signal | SL1 | 0 V |
| Unselected word line signals | WL0, WL2, WL3 | 0 V |

Figure 6A:
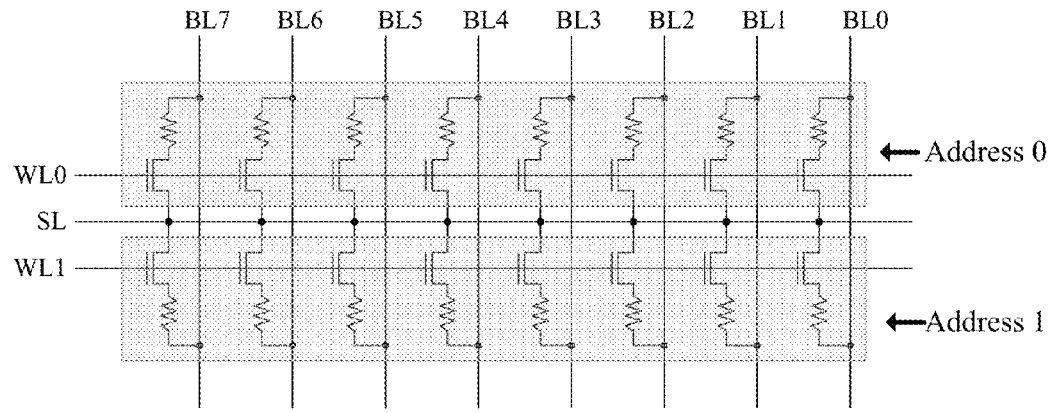
FIG. 6A is a diagram illustrating address mapping for an embodiment of a 1T-1R memory array.
Figure 6B:
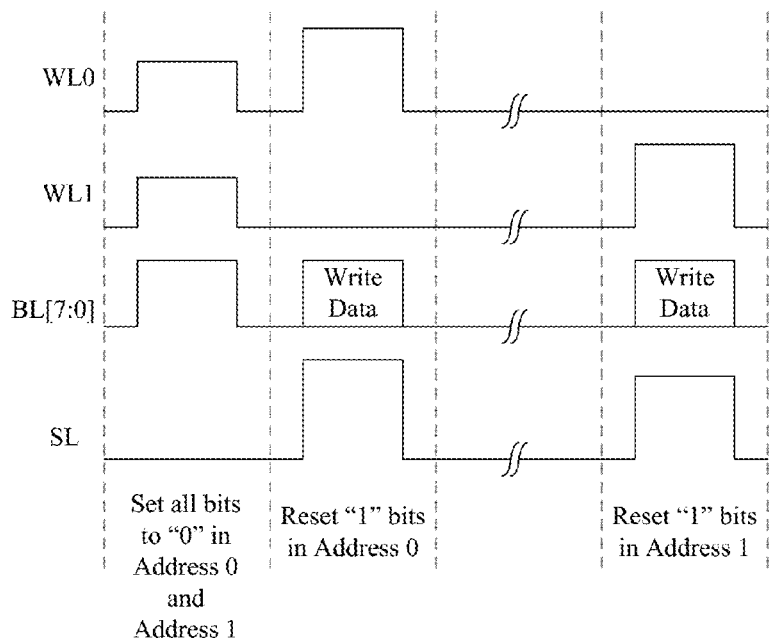
FIG. 6B is a timing diagram of signals used to write data to the 1T-1R memory array shown in FIG. 6A.

In an embodiment, control circuit 410 (FIG. 4) may map groups of memory cells in array 400 to address bytes as shown in FIGS. 6A and 6B. Control circuit 410 may map a group of eight memory cells corresponding to bit lines BL0 to BL7, word line signal WL0, and source line signal SL to address 0. Similarly, control circuit 410 may map a group of eight memory cells corresponding to bit lines BL0 to BL7, word line signal WL1, and source line signal SL to address 1. In an embodiment shown in FIG. 6A, memory cells mapped to address 0 may be positioned on eight adjacent columns of a first row of memory array 400 and memory cells mapped to address 1 may be positioned on the same eight adjacent columns but on a second row of memory array 400, where the first row is adjacent to the second row.

Referring to FIG. 6B, control circuit 410 may write data to memory cells in address 1 or address 0 by first setting all the bits in address 0 and address 1 to a first value, e.g., 0. Thereafter, control circuit 410 may reset bits in address 0 or address 1 to a second value, e.g., 1, based on the data. In an embodiment, control circuit 410 may reset bits in address 1 sequentially after resetting bits in address 0 based on the data.

Figure 7A:
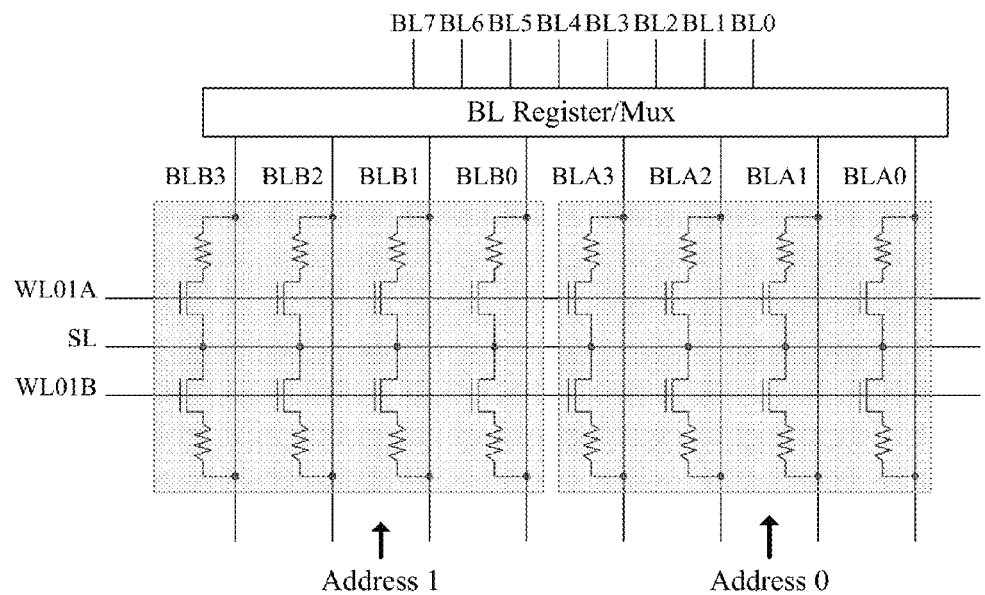
FIG. 7A is a diagram illustrating address mapping for an embodiment of a 1T-1R memory array.
Figure 7B:
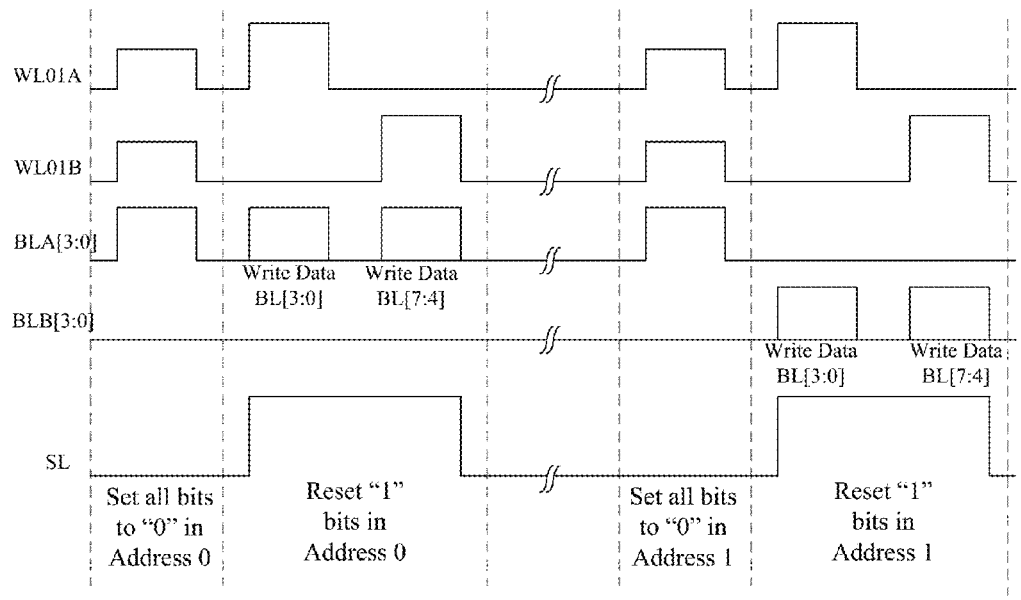
FIG. 7B is a timing diagram of signals used to write data to the 1T-1R memory array shown in FIG. 7A.

In another embodiment, control circuit 410 (FIG. 4) may map groups of memory cells in array 400 to address bytes as shown in FIGS. 7A and 7B. Control circuit 410 may map a first group of eight memory cells corresponding to first bit lines BLA0 to BLA3, word line signals WL01A and WL01B, and source line signal SL to address 0 and control circuit 410 may map a second group of eight memory cells corresponding to second bit lines BLB0 to BLB3, word line signals WL01A and WL01B, and source line signal SL to address 1. In an embodiment shown in FIG. 7A, memory cells in the first group of eight memory cells mapped to address 0 may be positioned on a first group of four adjacent columns on two adjacent rows and memory cells mapped to address 1 may be positioned on a second group of four adjacent columns on the two adjacent rows. A bit line register and multiplexer 712 may multiplex bit lines BL0 to BL7 from control circuit 410 to generate bit line signals BLA0 to BLA3 or bit line signals BLB0 to BLB3 to select memory cells in address 0 or address 1, respectively.

Referring to FIG. 7B, control circuit 410 may write data to memory cells in address 0 by first setting all the bits in address 0 to a first value, e.g., 0 and then resetting bits in address 0 to a second value, e.g., 1, based on the data. Note that control circuit 410 may first reset bits in memory cells mapped to address 0 corresponding to bit line signals BL[3:0] before resetting bits in memory cells corresponding to bit lines signals BL[7:4].

Similarly, control circuit 410 may write data to memory cells in address 1 by first setting all the bits in address 1 to a first value, e.g., 0 and then resetting bits in address 1 to a second value, e.g., 1, based on the data. Control circuit 410 may first reset bits in memory cells mapped to address 1 corresponding to bit line signals BL[3:0] before resetting bits in memory cells corresponding to bit lines signals BL[7:4].

FIG. 8A is a diagram of an embodiment of a voltage signal sequence applied to a portion of a memory array during a form operation. FIG. 8B is a timing diagram of an embodiment of the voltage signal sequence applied to the portion of the 1T-1R memory array shown in FIG. 8A during the form operation. A form operation is typically performed once on a memory cell during its manufacture. In an embodiment in which a form operation is performed substantially simultaneously on selected memory cells 806 and 808, control circuit 410 (FIG. 4) may apply the sequence of voltage signals as follows:

At step 1, charge unselected source line signal SL1 to an intermediate voltage to avoid punch-through, e.g., to 2V (hold selected source line signal SL0 at 0V).

Figure 12:
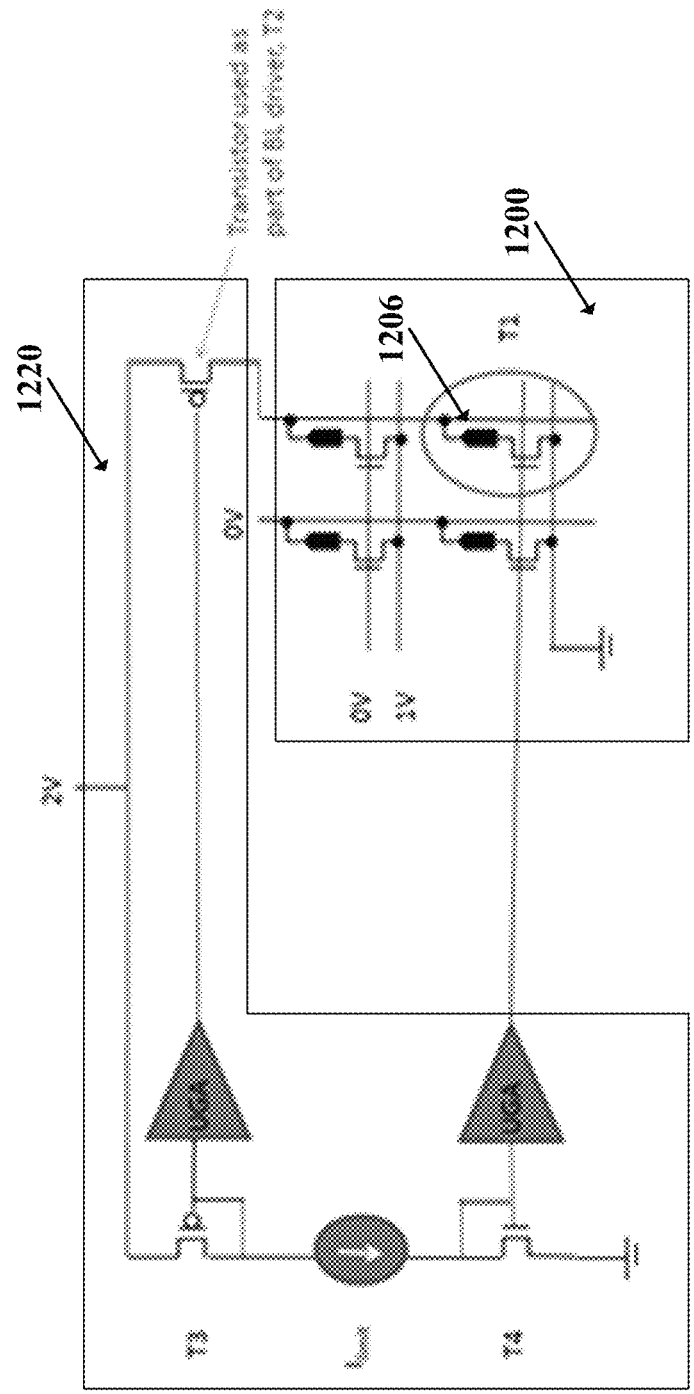
FIG. 12 is a diagram of an embodiment of a 1T-1R memory array including an embodiment of current limiting selector circuit.

At step 2, charge selected word line signals WL1 and WL0 to $V_{MIRROR}$, e.g., to 0.75V (hold unselected word line signals WL2 and WL3 to 0V). $V_{MIRROR}$ may be generated by a current control circuit included in a control circuit 410 (FIG. 4) to limit the current through the resistive element to avoid over programming and the local heating of such that can degrade long term reliability of the resistive element. FIG. 12 shows an exemplary current control circuit that is described in more detail below.

At step 3, charge selected bit line signal BL0 to $V_{FORM}$, e.g., 3.5V (hold unselected bit line signal BL1 to 0V).

At step 4, hold voltages in steps 1 to 3 during a form operation for a time $t_{FORM}$ for bit cells corresponding to selected word line signals WL0 and WL1 and selected bit line signal BL0.

At step 5, discharge selected bit line signal BL0.

At step 6, discharge unselected source line signal SL1.

At step 7, discharge selected word line signals WL0 and WL1.

FIG. 9A is a diagram of an embodiment of a voltage signal sequence applied to a portion of a memory array during a set operation. FIG. 9B is a timing diagram of an embodiment of the voltage signal sequence applied to the portion of the 1T-1R memory array shown in FIG. 9A during the set operation. In an embodiment in which a set operation is performed substantially simultaneously on selected memory cells 906 and 908, control circuit 410 (FIG. 4) may apply the sequence of voltage signals as follows:

At step 1, charge unselected source line signals SL1 to $V_{DD}$, e.g., 1.5V (hold selected source line signal SL0 to 0V).

At step 2, charge selected word line signals WL1 and WL0 to $V_{MIRROR}$, e.g., to 0.75V (hold unselected word line signals WL2 and WL3 to 0V).

At step 3, charge selected bit line signal BL0 to $V_{SET}$, e.g., 2V (hold unselected bit line signal BL1 to 0V).

At step 4, hold voltages in steps 1 to 3 during a set operation for a time $t_{SET}$ for bit cells corresponding to selected word line signals WL0 and WL1 and selected bit line signal BL0.

At step 5, discharge selected bit line signal BL0.

At step 6, discharge unselected source line signal SL0.

At step 7, discharge selected word line signals WL0 and WL1.

FIG. 10A is a diagram of an embodiment of a voltage signal sequence applied to a portion of a memory array during a reset operation. FIG. 10B is a timing diagram of an embodiment of the voltage signal sequence applied to the portion of the 1T-1R memory array shown in FIG. 10A during the reset operation. In an embodiment in which a reset operation is performed substantially simultaneously on selected memory cell 1006, control circuit 410 (FIG. 4) may apply the sequence of voltage signals as follows:

At step 1, charge all source line signals SL0 and SL1 to $V_{DD}$, e.g., 1.5V.

At step 2, charge all bit line signals BL0 and BL1 to $V_{DD}$, e.g., 1.5V.

At step 3, charge selected word line signal WL1 to $V_{DD}$, e.g., 1.5V (hold unselected word line signals WL0, WL2, and WL3 to 0V).

At step 4, charge selected source line signal SL0 and bit line signals BL0 and BL1 to 2.5V.

At step 5, charge selected word line signal WL1 to 3V.

At step 6, discharge selected bit line signal BL0 to 0V (this step marks the start of the reset operation).

At step 7, hold voltages in steps 1 to 6 during a reset operation for a time $t_{RESET}$ for bit cells corresponding to selected word line signal WL1 and selected bit line signal BL0.

At step 8, discharge selected source line signal SL0 and selected word line signals WL1.

At step 9, discharge unselected bit line signal BL1.

At step 10, discharge unselected source line signal SL1.

Figure 11A:
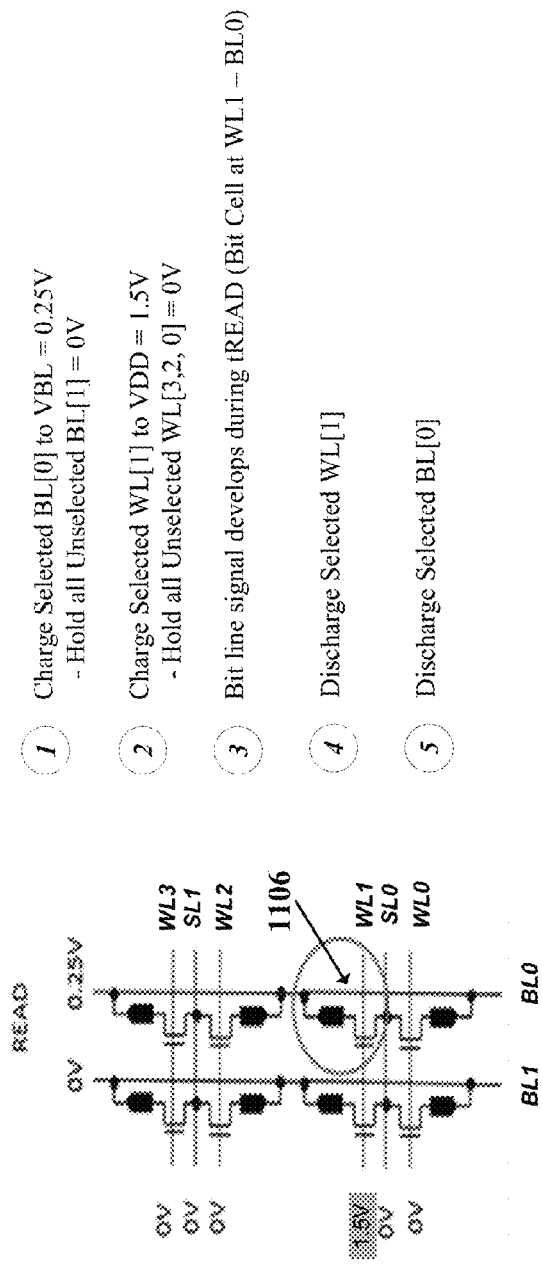
FIG. 11A is a diagram of an embodiment of a voltage signal sequence applied to a portion of a 1T-1R memory array during a read operation.
Figure 11B:
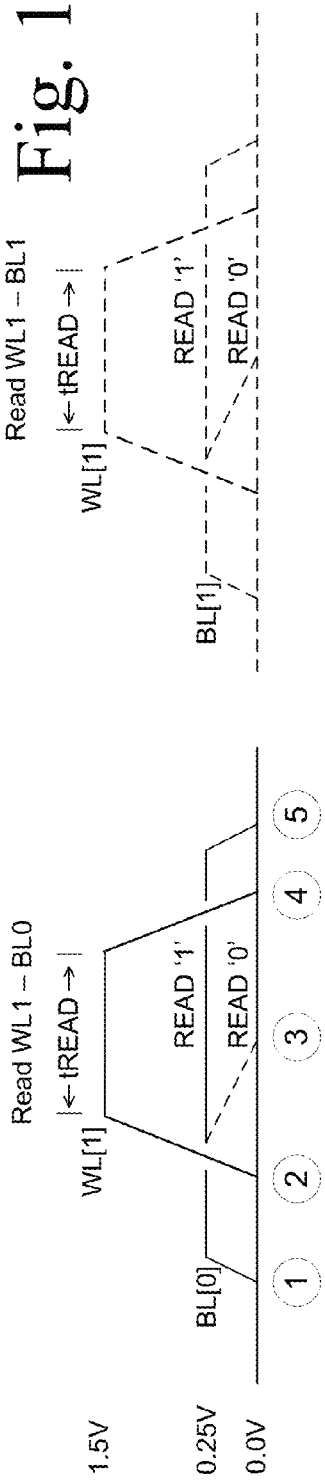
FIG. 11B is a timing diagram of an embodiment of the voltage signal sequence applied to the portion of the 1T-1R memory array shown in FIG. 10A during the read operation.

FIG. 11A is a diagram of an embodiment of a voltage signal sequence applied to a portion of a memory array during a read operation. FIG. 11B is a timing diagram of an embodiment of the voltage signal sequence applied to the portion of the 1T-1R memory array shown in FIG. 11A during the read operation. In an embodiment in which a read operation is performed substantially simultaneously on selected memory cell 1106, control circuit 410 (FIG. 4) may apply the sequence of voltage signals as follows:

At step 1, charge selected bit line signal BL0 to $V_{BL}$, e.g., 0.25V (hold unselected bit line signal BL1 to 0V).

At step 2, charge selected word line signal WL1 to $V_{DD}$, e.g., 1.5V (hold all unselected word line signals WL0, WL2, and WL3 to 0V).

At step 3, develop bit line signal during a read operation for a time $t_{READ}$ for bit cell corresponding to selected word line signal WL1 and selected bit line signal BL0.

At step 4, discharge selected word line signal WL1.

At step 5, discharge selected bit line signal BL0.

FIG. 12 is a diagram of an embodiment of a 1T-1R memory array 1200 including an embodiment of bit line current control circuit 1220. Memory array 1200 may similar to memory array 200 including a plurality of columns extending in a first direction and a plurality of rows extending in a second direction perpendicular to the first direction. In an embodiment of array 1200, a column of memory cells is coupled to receive a common bit line signal while a row of memory cells is coupled to receive a common word line signal and a common source line signal as described previously in relation to memory array 200. In an embodiment, bit lines in memory array 1200 may be coupled to a bit line control circuit 1220 configured to control current provided to the plurality of resistive memory cells. Bit line control circuit 1220 may include transistors T2, T3, and T4 configured to form a current mirror with selected memory cells. In this configuration, the specific voltage that will appear on the bit line line may vary as a function of the voltage threshold of the select transistor in selected memory cell 1206. If the voltage threshold is low, the bit line may rise (charged by the cell current) until the normalized saturation drain current of the select transistor T1 matches the saturation drain current of the bit line transistor T2. According, the variation of a threshold voltage of the cell select transistor T1 (in an advanced Complementary Metal Oxide Semiconductor (CMOS) process where the variation in transistor threshold voltage from device to device can be relatively large, for example 150-200 mV) may be addressed by the self-compensating effect of the current mirror configuration between the select transistor T1 and transistors T2, T3, and T4.

During a form or set operation, transistor T2 may limit the current flowing through selected memory cell 1206 to lower variability and improve bit yield and power consumption. Mismatch issues are avoided since driver transistors T2, T3, and T4 are typically larger in area than the select transistor T1 included in memory cell 1206. In an embodiment, transistors T2, T3, and T4 may be Metal Oxide Semiconductor (MOS) transistors.

It will also be appreciated by persons of ordinary skill in the art that the present disclosure is not limited to what has been particularly shown and described hereinabove. Rather, the scope of the present disclosure includes both combinations and sub-combinations of the various features described hereinabove as well as modifications and variations which would occur to such skilled persons upon reading the foregoing description. Thus the disclosure is limited only by the appended claims.

The invention claimed is:

1. A method of operating an array of memory cells, comprising:

applying a selected source line voltage to a selected source line corresponding to a selected memory cell that is selected for an operation;

applying an unselected source line voltage that is different from the selected source line voltage to unselected source lines corresponding to unselected memory cells that are not selected for the operation;

applying a selected word line voltage to a selected word line corresponding to the selected memory cell; and forming or setting the selected memory cell in response to applying the selected word line voltage to the selected word line;

wherein each memory cell includes a resistive memory element electrically coupled in series to a corresponding transistor having a gate coupled to receive a corresponding one of a plurality of word lines and a source coupled to receive a corresponding one of a plurality of source lines.

2. The method of claim 1, wherein the method further comprises:

applying the selected word line voltage to the selected word line after applying the unselected source line voltage to the unselected source lines.

3. The method of claim 2, wherein the unselected source line voltage is higher than the selected source line voltage.

4. The method of claim 2, wherein the unselected source line voltage is lower than a selected bit line voltage.

5. A method of operating an array of resistive memory cells, comprising:

applying a selected source line voltage to a selected source line corresponding to a selected memory cell that is selected for an operation;

applying an unselected source line voltage that is different from the selected source line voltage to unselected source lines corresponding to unselected memory cells that are not selected for the operation;

applying a selected word line voltage to a selected word line corresponding to the selected memory cell; and performing the operation on the selected memory cell;

wherein the array of resistive memory cells is coupled to receive a plurality of word lines, a plurality of source lines, and a plurality of bit lines; and wherein each pair of resistive memory cells includes a first resistive memory element, a second resistive memory element, a first switching element electrically coupled in series to the first resistive memory element and having a first gate coupled to receive a first word line of the plurality of word lines and a first source coupled to receive a first source line of the plurality of source lines, and a second switching element electrically coupled in series to the second resistive memory element and having a second gate to receive a second word line of the plurality of word lines and a second source electrically coupled to the first source to receive the first source line of the plurality of source lines.

6. The method of claim 5, further comprising:

mapping groups of resistive memory cells on adjacent columns or adjacent rows or a combination of adjacent rows and adjacent columns to corresponding addressable bytes of memory;

identifying as a selected byte, one of the groups of memory cells corresponding to one of the addressable bytes of memory that is selected for an operation; and performing the operation on the selected byte based at least in part on data.

7. The method of claim 6, wherein performing the operation comprises forming each of the memory cells in the selected byte substantially simultaneously.

8. The method of claim 6, further comprising:

mapping groups of eight resistive memory cells arranged on eight adjacent columns on a row of the array to the corresponding addressable bytes of memory;

identifying as the selected byte, one of the group of eight memory cells corresponding to the one of the addressable bytes of memory that is selected for a write operation;

setting each of the eight memory cells in the selected byte of memory cells to a first value; and resetting at least some of the eight memory cells in the selected byte of memory cells to a second value based at least in part on the data.

9. The method of claim 8, wherein setting each of the eight memory cells in the selected byte occurs substantially simultaneously.

10. The method of claim 6, further comprising:

mapping groups of eight memory cells arranged on four adjacent columns on two adjacent rows of the array to the corresponding addressable bytes of memory;

identifying as the selected byte, one of the group of eight memory cells corresponding to one of the addressable bytes of memory that is selected for a write operation;

setting each of the eight memory cells in the selected byte of memory cells to a first value; and resetting at least some of the memory cells in the selected byte of memory cells to a second value based at least in part on the data.

11. The method of claim 10, wherein resetting at least some of the memory cells further comprises:

resetting a first group of the memory cells in the selected byte of memory cells to the second value in response to a first bit line; and resetting a second group of memory cells in the selected byte of memory cells to the second value in response to a second bit line word line.

12. The method of claim 5, further comprising applying the selected word line voltage to the selected word line after applying the unselected source line voltage to the unselected source lines.

13. The method of claim 5, further comprising:

applying an intermediate source line voltage to the selected source line before applying the selected source line voltage to the selected source line, the intermediate source line voltage being lower than the selected source line voltage; and applying an intermediate word line voltage to the selected word line before applying the selected word line voltage to the selected word line, the intermediate word line voltage being lower than the selected word line voltage.

14. The method of claim 13, wherein the applying the intermediate source line voltage to the selected source line occurs before applying the intermediate word line voltage to the selected word line; and wherein the applying the selected source line voltage to the selected source line occurs before applying the selected word line voltage to the selected word line.

15. A memory device, comprising:

a plurality of word lines;

a plurality of source lines; and an array of resistive memory cells comprising pairs of resistive memory cells, each pair of resistive memory cells comprising:

a first resistive memory element;

a second resistive memory element;

a first switching element electrically coupled in series to the first resistive memory element and having a first gate coupled to receive a first word line of the plurality of word lines and a first source coupled to receive a first source line of the plurality of source lines; and a second switching element electrically coupled in series to the second resistive memory element and having a second gate coupled to receive a second word line of the plurality of word lines and a second source electrically coupled to the first source to receive the first source line of the plurality of source lines, wherein unselected source lines of the plurality of source lines corresponding to unselected resistive memory cells are to receive an unselected source line voltage that is different from a selected source line voltage received by selected source lines of the plurality of source lines corresponding to selected resistive memory cells.

16. The memory device of claim 15, further comprising:

a control circuit to select a particular memory cell for an operation based at least in part on an application of a first select word line voltage to the first gate of the first switching element and an application of a second select word line voltage to the second gate of the second switching element.

17. The memory device of claim 15, further comprising:

a plurality of bit lines coupled to the array of resistive memory cells;

wherein the first resistive memory element has a first terminal electrically coupled to receive a first bit line of the plurality of bit lines; and wherein the second resistive memory element has a second terminal electrically coupled to receive the first bit line of the plurality of bit lines.

18. The memory device of claim 17, further comprising a bit line current control circuit electrically coupled to the plurality of bit lines and to control current to the plurality of resistive memory cells.

19. The memory device of claim 18, wherein the bit line current control circuit comprises a current mirror.

20. The memory device of claim 18, wherein the bit line control circuit is to limit current flowing through a memory cell selected for a form or a set operation.

* * * * *